(12) United States Patent
Lee

(10) Patent No.: US 8,598,616 B2
(45) Date of Patent: Dec. 3, 2013

(54) LIGHT EMITTING DEVICE AND LIGHT UNIT USING THE SAME

(75) Inventor: Gun Kyo Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 19 days.

(21) Appl. No.: 13/388,342

(22) PCT Filed: Oct. 20, 2010

(86) PCT No.: PCT/KR2010/007204
§ 371 (c)(1),
(2), (4) Date: Feb. 1, 2012

(87) PCT Pub. No.: WO2011/049374
PCT Pub. Date: Apr. 28, 2011

(65) Prior Publication Data
US 2012/0126280 A1    May 24, 2012

(30) Foreign Application Priority Data
Oct. 21, 2009  (KR) .................. 10-2009-0100181

(51) Int. Cl.
*H01L 33/00* (2010.01)
*H01L 23/36* (2006.01)

(52) U.S. Cl.
USPC ...... 257/99; 257/706; 257/796; 257/E33.075; 257/E23.101; 257/E23.104

(58) Field of Classification Search
USPC ........... 257/99, 706, 796, E33.075, E23.101, 257/E23.104
See application file for complete search history.

(56) References Cited

U.S. PATENT DOCUMENTS

| 8,174,832 B2* | 5/2012 | Yu et al. ............... 361/709 |
| 8,436,391 B2* | 5/2013 | Tran et al. .............. 257/99 |
| 2005/0139846 A1* | 6/2005 | Park et al. ............... 257/98 |
| 2009/0039381 A1* | 2/2009 | Kim et al. ............... 257/99 |
| 2010/0133555 A1* | 6/2010 | Negley ................... 257/88 |
| 2010/0171143 A1* | 7/2010 | Paek et al. .............. 257/99 |
| 2010/0230708 A1* | 9/2010 | Tran ...................... 257/99 |
| 2012/0061716 A1* | 3/2012 | Yu et al. ................. 257/99 |
| 2012/0205706 A1* | 8/2012 | Shuja .................... 257/98 |

FOREIGN PATENT DOCUMENTS

| JP | 2007-042755 A | 2/2007 |
| JP | 2007-335762 A | 12/2007 |
| KR | 10-2007-0037883 A | 4/2007 |
| KR | 10-2008-0079745 A | 9/2008 |
| KR | 10-2009-0017391 A | 2/2009 |
| WO | WO 2005/083804 A1 | 9/2005 |
| WO | WO 2009/052702 A1 | 4/2009 |

* cited by examiner

*Primary Examiner* — Victor A Mandala
(74) *Attorney, Agent, or Firm* — KED & Associates, LLP

(57) ABSTRACT

Disclosed are a light emitting device and a light unit using the same. The light emitting device includes a body, a light emitting diode installed in the body, a plurality of lead frames disposed in the body and electrically connected to the light emitting diode; and a heat dissipation member received in the body, thermally connected to the light emitting diode, and having a plurality of heat dissipation fins exposed from a lower surface of the body.

20 Claims, 6 Drawing Sheets the embodiment relates to a light emitting device and a light unit using the same.

BACKGROUND ART

A light emitting diode (LED) is a semiconductor light emitting device that converts current into light. Recently, the LED can represent a white color having superior light efficiency by employing a phosphor material or combining LEDs having a various colors.

In addition, since the brightness of the light emitting device employing the LED is increased, so that the light emitting device employing the LED can be used as a light source in various products, such as a lighting indicator, a character indicator, a lighting device and an image indicator.

DISCLOSURE

Technical Problem

The embodiment provides a light emitting device capable of improving a heat dissipation characteristics and a light unit using the same.

Technical Solution

A light emitting device includes a body, a heat dissipation member including a support portion disposed in the body and a plurality of heat dissipation fins extending to at least a lower surface of the body from the support portion, first and second lead frames disposed in the body and spaced apart from the heat dissipation member, and a light emitting diode disposed on the support portion of the heat dissipation member, thermally connected to the support portion, and electrically connected to the first and second lead frames.

Advantageous Effects

According to the embodiment, a light emitting device capable of improving heat dissipation characteristics and a light unit using the same can be disposed.

BEST MODE

Mode for Invention

Figure 1:
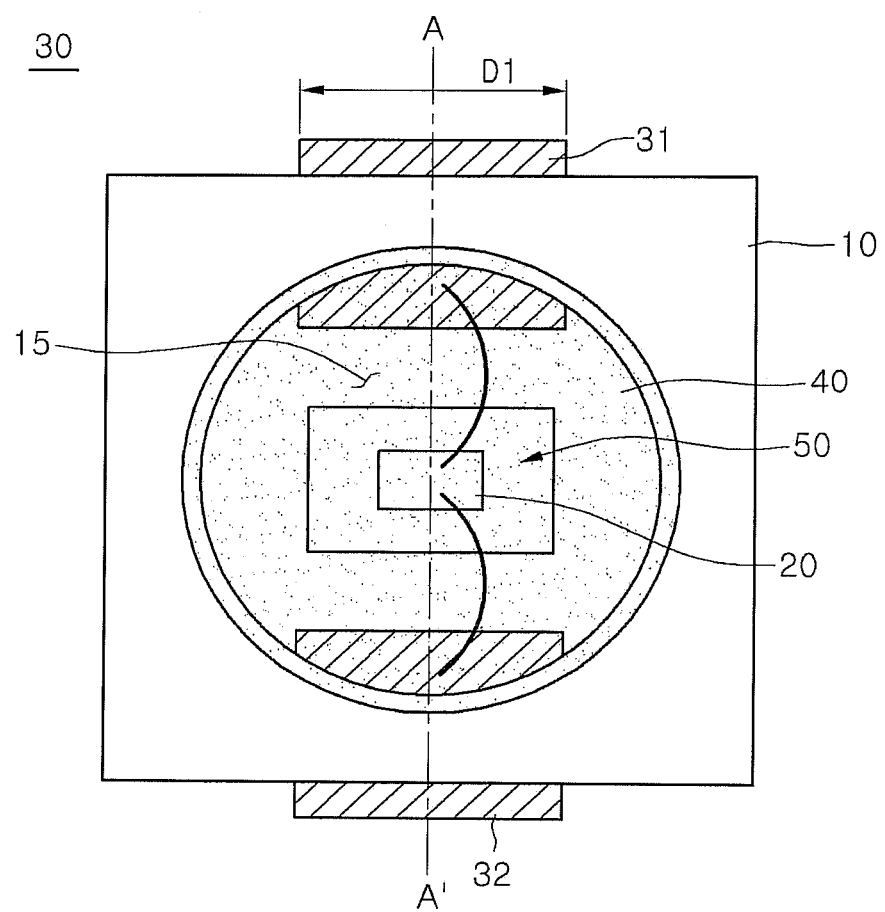
FIG. 1 is a plan view showing a light emitting device according to the embodiment.

Hereinafter, the light emitting device having an improved heat dissipation characteristic according to the embodiment and the light unit using the same will be described with reference to accompanying drawings.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

Hereinafter, embodiments will be described with reference accompanying drawings. The thickness and size of each layer shown in the drawings may be exaggerated, omitted or schematically drawn for the purpose of convenience or clarity. In addition, the size of elements does not utterly reflect an actual size.

Figure 2:
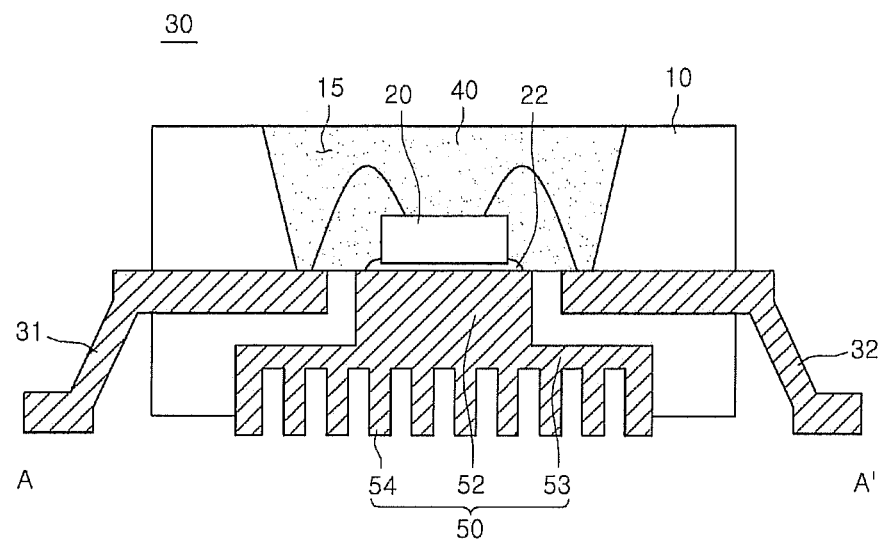
FIG. 2 is a sectional view showing the light emitting device according to the embodiment.

FIG. 1 is a top view showing a light emitting device 30 according to the embodiment, and FIG. 2 is a sectional view taken along line A-A' of FIG. 1.

Referring to FIGS. 1 and 2, the light emitting device 30 includes a body 10 having a cavity 15 disposed therein with a light emitting diode 20, a molding member 40 covering the light emitting diode 20 formed in the cavity 15, a plurality of lead frames 31 and 32 disposed in the body 10 and electrically connected to the light emitting diode 20, and a heat dissipation member 50 disposed in the body, thermally connected to the light emitting diode 20, and having a plurality of heat dissipation fins to dissipate heat.

The cavity 15 is disposed therein with the light emitting diode 20 at an upper portion of the body 10. The body 10 may include various materials including ceramic, silicon, or resin. The body 10 may be integrated through an injection molding scheme or may have a stack structure of a plurality of layers.

The cavity 15 may have a cup shape or a concave container shape having a polygonal shape, an oval shape, or a circular shape. The periphery surface of the cavity 15 is may be vertical lateral surface or an inclined lateral surface based on a light distribution angle of the light emitting diode 20. According to another embodiment, if the body 10 has a stack structure of plural layers, the cavity 15 may be formed through a patterning process, a punching process, a cutting process, or an etching process. In addition, if the body 10 is formed through an injection molding scheme, the cavity 15 may be formed through a metallic frame having the body 10 and the cavity 15. The surface of the cavity 15 may be coated with a material having a superior reflective effect. For example, the surface of the cavity 15 may be coated with white PSR (Photo Solder Resist) ink, silver (Ag), or aluminum (Al). Accordingly, the light emission of the light emitting device 30 can be improved.

One ends of the first and second lead frames 31 and 32 are electrically connected to the light emitting diode 20 and opposite ends of the first and second lead frames 31 and 32 are electrically connected to a substrate (not shown) on which the light emitting device 30 is mounted, thereby supplying power to the light emitting diode 20.

Inner portions of the first and second lead frames 31 and 32 are exposed in the cavity 15, and outer portions of the first and second lead frames 31 and 32 are exposed out of the body 10. The outer portions of the first and second lead frames 31 and 32 can extend to a lower surface of the body 10, but the embodiment is not limited thereto.

The light emitting diode 20 may include at least one of red, green, and blue light emitting diodes to emit red, green, or blue light, but the embodiment is not limited thereto. In addition, the light emitting diode 20 may include an ultraviolet (UV) diode to emit light in a UV band.

The light emitting diode 20 is bonded to the heat dissipation member 50 by using an adhesive agent 22. The adhesive agent 22 includes conductive solder or paste representing superior thermal conductivity. According to another embodiment, the adhesive agent 22 may include a non-conductive resin based adhesive agent.

The heat dissipation member 50 may include metallic-based material or resin-based material representing superior thermal conductivity, and may be disposed in the body 10. The heat dissipation member 50 is spaced apart from the first and second lead frames 31 and 32 and thermally connected to the light emitting diode 20 to dissipate heat emitted from the light emitting diode 20.

The width of a top surface of the heat dissipation member 50 in the cavity 15 may be identical to that of the first and second lead frames 31 and 32. However, the width of the top surface of the heat dissipation member 50 may be greater than that of the first and second lead frames 31 and 32 by taking into consideration heat dissipation efficiency.

Figure 3:
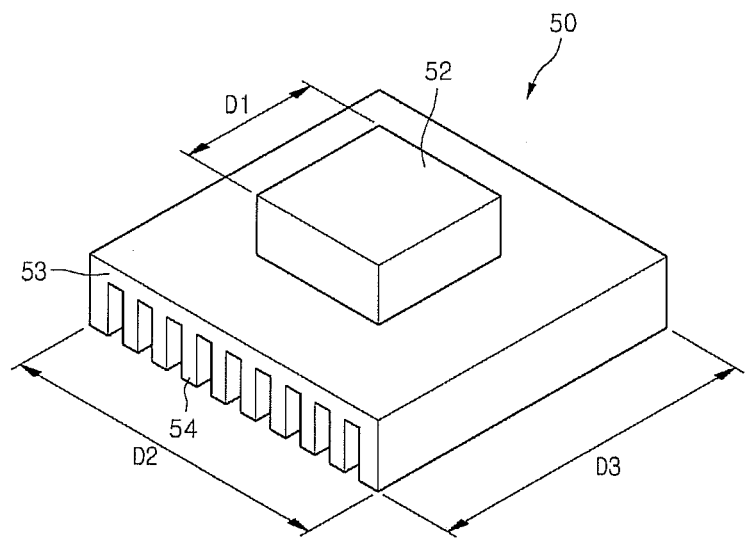
FIG. 3 is a perspective view showing a heat dissipation member of the light emitting device according to the embodiment.

FIG. 3 is a perspective view showing the heat dissipation member 50 of the light emitting device 30.

Referring to FIGS. 2 and 3, the heat dissipation member 50 includes a support portion 52, a connection portion 53, and the heat dissipation fin 54. The connection portion 53 may include the heat dissipation fin 54.

The support portion 52 of the heat dissipation member 50 is disposed on the bottom surface of the cavity 15 to fixedly support the light emitting diode 20. A top surface of the support portion 52 may be arranged at least in line with top surfaces of the first and second lead frames 31 and 32, or may have a step structure with respect to the top surfaces of the first and second lead frames 31 and 32.

The support portion 52 has a top surface width D1 at least greater than a lower surface width of the light emitting diode 20 under the light emitting diode 20, and may be exposed through a bottom surface of the cavity 15.

The connection portion 53 extends downward from the support portion 52 while being integrated with the support portion 52, and has widths D2 and D3 greater than the top surface width D1 of the support portion 52. The connection portion 53 is disposed at a lower portion thereof with the heat dissipation fins 54. The widths D2 and D3 of the connection portion 53 may be identical to each other or different from each other. In addition, the width D3 of the connection portion 53 may be increased corresponding to the width of the body 10.

A part of the connection portion 53 further extends downward from the first and second lead frames 31 and 32, and may be spaced apart from the first and second lead frames 31 and 32. The width of the connection portion 53 may be at least greater than the bottom surface width of the cavity 15.

The heat dissipation fin 54 extends to at least the lower surface of the body 10 from the connection portion 53 of the heat dissipation member 50. The heat dissipation fin 54 may extend in an opposite end of the light emitting diode 20 at a lower portion of the heat dissipation member 50. Lower ends of the heat dissipation fin 54 may further protrude at least downward from the lower surface of the body 10.

The heat dissipation fins 54 may alternately arranged with each other in the arrangement directions of the first and second lead frames 31 and 32. The interval between leftmost and rightmost heat dissipation fins 54 may be at least greater than that of the support portion 52.

Each heat dissipation fin 54 may be at least higher than the thickness of the connection portion 53, but the embodiment is not limited thereto.

The heat dissipation fins 54 may have regular or irregular intervals therebetween. According to another example, the heat dissipation fins 54 may have wide intervals at a first region thereof corresponding to the light emitting diode 20 and intervals narrower than those of the first region at a remaining region except for the first region.

The heat dissipation fins 54 formed in the connection portion 53 are disposed to increase the surface area for dissipating heat. The heat dissipation fins 54 may have various shapes such as a plate shape and a cylindrical shape. The connection portion 53 may have an area wider than that of the support portion 52 within the allowable receiving range of the body 10, so that the heat dissipation efficiency can be improved.

The heat dissipation member 50 may have a thickness at least thicker than a thickness between the bottom surface of the cavity 15 and the lower surface of the body 10

The molding member 40 covers the parts of the first and second lead frames 31 and 32 and the light emitting diode 20. The molding member 40 is formed in the cavity 15 to mold components disposed in the cavity 15.

The molding member 40 may include transmissive resin materials such as silicon or epoxy and may contain at least one kind of phosphor materials, but the embodiment is not limited thereto.

A lens may be disposed on the molding member 40, and may include at least one of concave and convex lenses.

As described above, in the light emitting device 30 according to the embodiment, the connection portion 53 having the heat dissipation fins 54 is formed at the rear surface of the heat dissipation member 50 connected to the light emitting diode 20, so that heat generated from the light emitting device 30 can be effectively dissipated.

Figure 4:
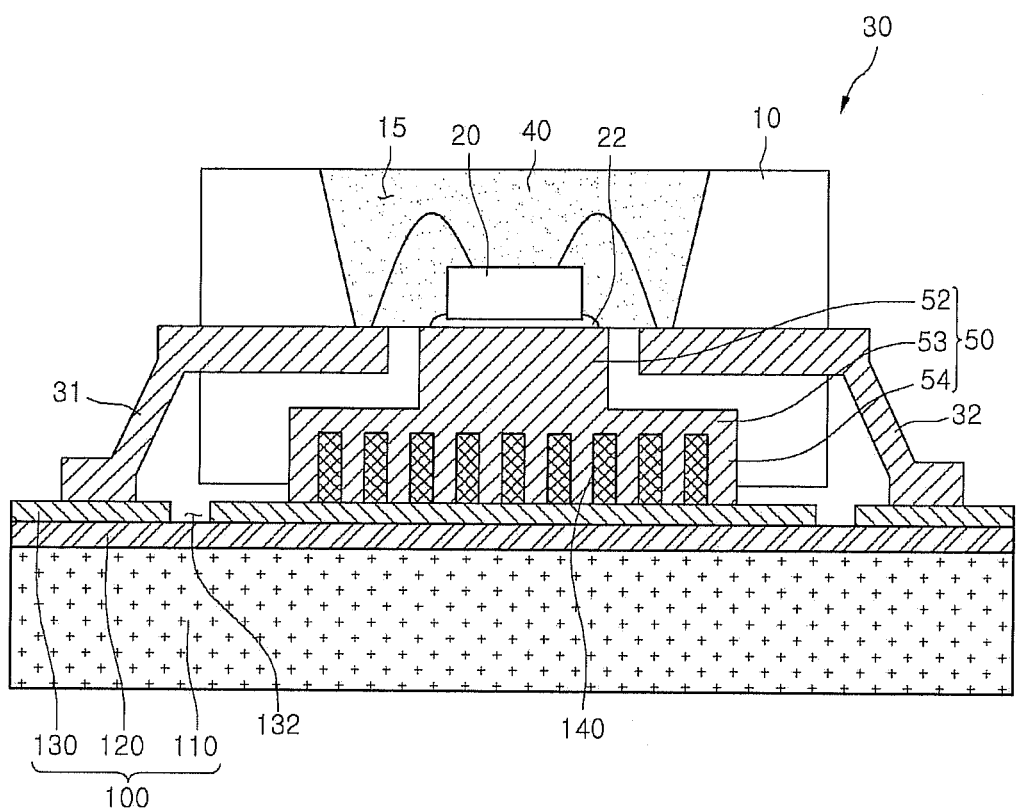
FIG. 4 is a sectional view showing a light unit using the light emitting device according to the embodiment.

FIG. 4 is a sectional view showing a light unit according to the embodiment, and particularly shows a case in which the light emitting device 30 is mounted on a printed circuit board (e.g. Metal Core PCB) 100. In the following description about FIG. 4, the structure of the light emitting device 30 will not be further described in order to avoid redundancy.

The PCB 100 may include a metallic layer (groove part) 110 serving as a base substrate, an insulating layer 120 formed on the metallic layer 110, and a circuit pattern 130 formed on the insulating layer 120. In this case, the metallic layer 110 may include metal such as aluminum (Al), and the circuit pattern 130 may include at least copper (Cu).

The light emitting device 30 is mounted on the circuit pattern 130 of the PCB 100.

The first and second lead frames 31 and 32 of the light emitting device 30 are bonded to the circuit pattern 130, so that the first and second lead frames 31 and 32 are electrically connected to the circuit pattern 130. The heat dissipation member 50 exposed through the rear surface of the light emitting device 30 is bonded to the circuit pattern 130.

The circuit pattern 130 includes a plurality of pads spaced apart from each other at a predetermined interval, and the pads may be connected to the first lead frame 31, the second lead frame 32, and the heat dissipation member 50.

The light emitting device 30 may be mounted on a circuit pattern 130 by using a solder 140. When the light emitting device 30 is mounted by using the solder 140, the solder is disposed between the heat dissipation fins 54 of the connection portion 53. Accordingly, the contact area between the solder 140 and the heat dissipation member 50 is expanded, so that heat dissipation efficiency can be improved.

Figure 5:
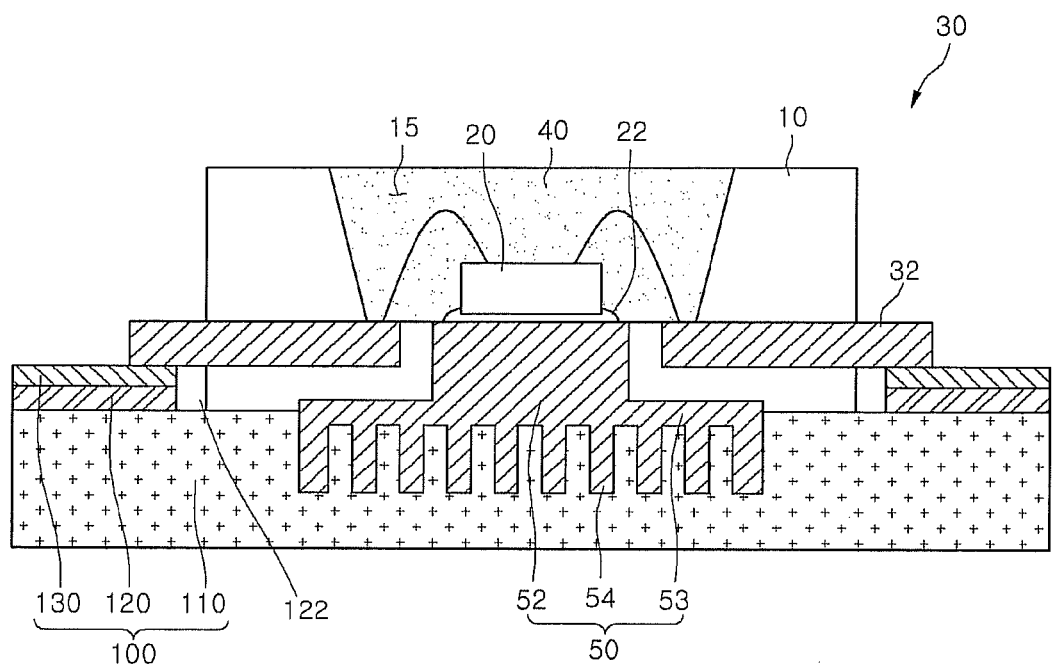
FIG. 5 is a sectional view showing a light unit using a light emitting device according to another embodiment.

FIG. 5 is a sectional view showing a light unit according to another embodiment, and particularly shows a case in which the light emitting device 30 is mounted on an PCB (e.g. Metal Core PCB) 100. In the following description about FIG. 5, the structure of the light emitting device 30 will not be further described in order to avoid redundancy.

The PCB 100 may include the metallic layer 110 serving as a base substrate, the insulating layer 120 formed on the metallic layer 110, and the circuit pattern 130 formed on the insulating layer 120. In this case, the metallic layer 110 may include metal such as Al, and the circuit pattern 130 may include at least Cu.

When the light emitting device 30 is mounted on the PCB 100 according to the present embodiment, the connection portion 53 of the light emitting device 30 may be fixed on the metallic layer 110 of the MCPCB 100.

The PCB 100 includes a groove part 122 to expose the metallic layer 110 by selectively removing the insulating layer 120.

The connection portion 53 protruding through the lower surface of the light emitting device 30 may be fixed on the metallic layer 110 through the groove part 122. The first and second lead frames 31 and 32 exposed at both sides of the light emitting device 30 may be electrically connected to the circuit pattern 130 of the PCB 100. In this case, the connection portion 53 and the heat dissipation fins 54 of the light emitting device 30 may protrude from the lower surface of the body 10 within the allowable range of the body 10.

The connection portion 53 includes the heat dissipation fins 54 that may expand the contact area, so that heat can be effectively transferred to the metallic layer 110. The heat generated from the light emitting device 30 is transferred to the metallic layer 110 through the connection portion 53, so that the heat dissipation efficiency of the light emitting device 30 can be effectively improved.

Figure 6:
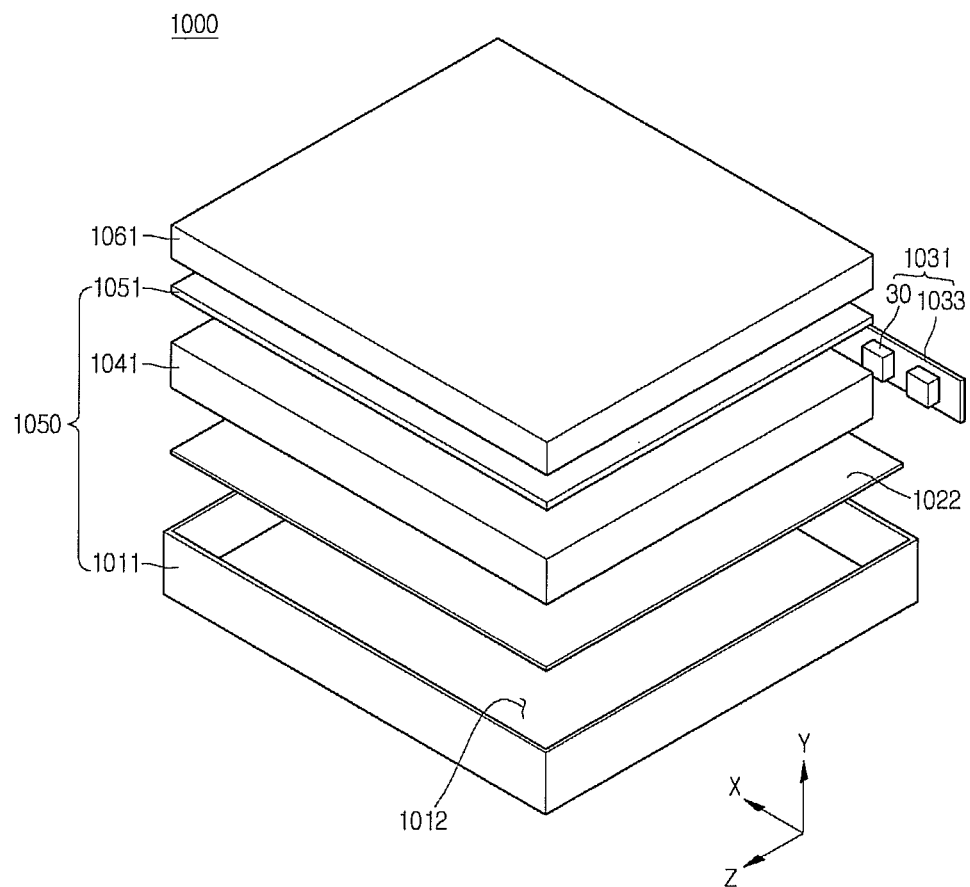
FIG. 6 is a perspective view showing a display device according to the embodiment.
Figure 7:
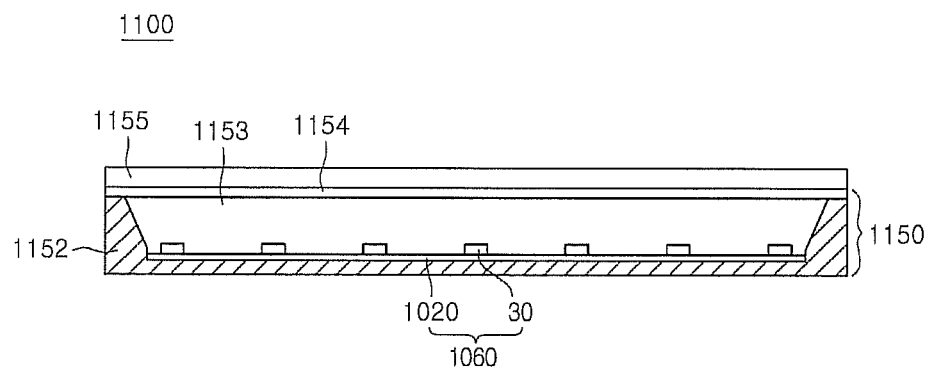
FIG. 7 is a view showing another example of the display device according to the embodiment.
Figure 8:
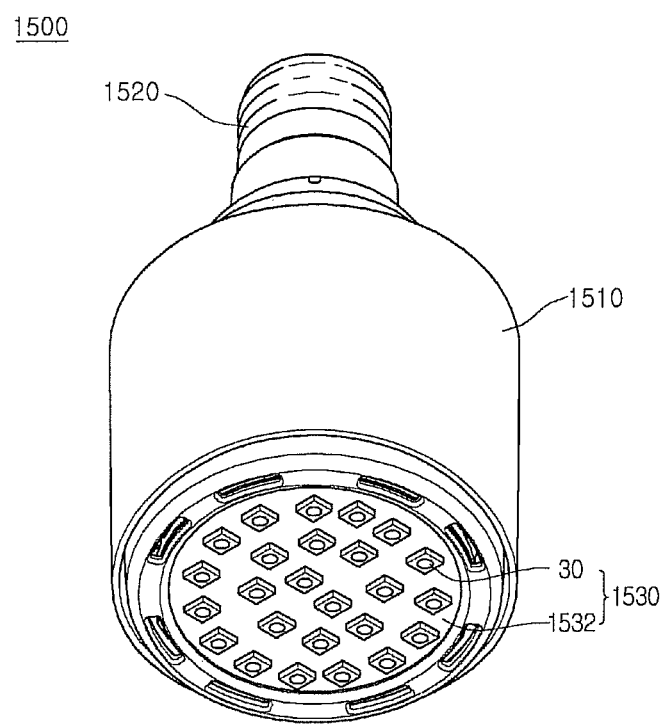
FIG. 8 is a view showing a lighting apparatus according to the embodiment.

The light emitting device according to the embodiment may be applied to the light unit. The light unit has a structure in a plurality of light emitting devices are arrayed. The light unit may include a display device as shown in FIGS. 6 and 7 and a lighting apparatus as shown in FIG. 8. In addition, the light unit may include a lighting lamp, a signal lamp, a headlight of a vehicle, and an electric signboard.

FIG. 6 is an exploded perspective view showing a display device 1000 according to the embodiment.

Referring to FIG. 6, the display device 1000 according to the embodiment includes a light guide plate 1041, a light emitting module 1031 for supplying the light to the light guide plate 1041, a reflective member 1022 disposed under the light guide plate 1041, an optical sheet 1051 disposed on the light guide plate 1041, a display panel 1061 disposed on the optical sheet 1051, and a bottom cover 1011 for receiving the light guide plate 1041, the light emitting module 1031, and the reflective member 1022. However, the embodiment is not limited to the above structure.

The bottom cover 1011, the reflective sheet 1022, the light guide plate 1041 and the optical sheet 1051 may constitute a light unit 1050.

The light guide plate 1041 diffuses the light to provide surface light. The light guide plate 1041 may include transparent material. For instance, the light guide plate 1041 may include one of acryl-based resin, such as PMMA (polymethyl methacrylate), PET (polyethylene terephthalate), PC (polycarbonate), COC (cyclic olefin copolymer) and PEN (polyethylene naphthalate) resin.

The light emitting module 1031 is disposed at one side of the light guide plate 1041 to supply the light to at least one side of the light guide plate 1041. The light emitting module 1031 serves as the light source of the display device.

At least one light emitting module 1031 is disposed to directly or indirectly supply the light from one side of the light guide plate 1041. The light emitting module 1031 may include a board 1033 and light emitting devices 30 according to the embodiments. The light emitting devices 30 are arranged on the board 1033 while being spaced apart from each other at the predetermined interval.

The board 1033 may include a printed circuit board (PCB, not shown), but the embodiment is not limited thereto. In addition, the board 1033 may also include a metal core PCB (MCPCB) or a flexible PCB (FPCB) as well as the PCB, but the embodiment is not limited thereto. If the light emitting devices 30 are installed on the side of the bottom cover 1011 or on a heat dissipation member, the board 1033 may be omitted. The heat dissipation member partially makes contact with the top surface of the bottom cover 1011.

In addition, the light emitting devices 30 are arranged such that light exit surfaces of the light emitting devices 30 are spaced apart from the light guide plate 1041 by a predetermined distance, but the embodiment is not limited thereto. The light emitting device devices 30 may directly or indirectly supply the light to a light incident surface, which is one side of the light guide plate 1041, but the embodiment is not limited thereto.

The reflective member 1022 is disposed under the light guide plate 1041. The reflective member 1022 reflects the light, which travels downward through the lower surface of the light guide plate 1041, toward the display panel 1061, thereby improving the brightness of the display panel 1061. For instance, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for instance, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by blocking the light generated from the light emitting module 1031 or allowing the light to pass therethrough. The display device 1000 can be applied to various portable terminals, monitors of laptop computers, monitors or laptop computers, and televisions.

The optical sheet 1051 is disposed between the display panel 1061 and the light guide plate 1041 and includes at least one transmissive sheet. For instance, the optical sheet 1051 includes at least one of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be disposed on the display panel 1061, but the embodiment is not limited thereto.

The light guide plate 1041 and the optical sheet 1051 can be disposed in the light path of the light emitting module 1031 as optical members, but the embodiment is not limited thereto.

FIG. 7 is a sectional view showing a display device according to the embodiment.

Referring to FIG. 7, the display device 1100 includes a bottom cover 1152, a board 1020 on which the light emitting device devices 30 are arranged, an optical member 1154, and a display panel 1155.

The board 1020 and the light emitting device devices 30 may constitute the light emitting module 1060. In addition, the bottom cover 1152, at least one light emitting module 1060, and the optical member 1154 may constitute the light unit 1150.

The bottom cover 1151 can be disposed with a receiving section 1153, but the embodiment is not limited thereto.

The optical member 1154 may include at least one of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto the display panel 1155, and the brightness enhanced sheet improves the brightness by reusing the lost light.

The optical member 1154 is disposed on the light emitting module 1060 in order to convert the light emitted from the light emitting module 1060 into the surface light. In addition, the optical member 1154 may diffuse or collect the light.

FIG. 8 is a perspective view showing a lighting device according to the embodiment.

Referring to FIG. 8, the lighting device 1500 includes a case 1510, a light emitting module 1530 installed in the case 1510, and a connection terminal 1520 installed in the case 1510 to receive power from an external power source.

Preferably, the case 1510 includes material having superior heat dissipation property. For instance, the case 1510 includes metallic material or resin material.

The light emitting module 1530 may include a board 1532 and light emitting device devices 30 installed on the board 1532. The light emitting device devices 30 are spaced apart from each other or arranged in the form of a matrix.

The board 1532 includes an insulating member printed with a circuit pattern. For instance, the board 1532 includes a PCB, an MCPCB, an FPCB, a ceramic PCB, and an FR-4 substrate.

In addition, the board 1532 may include material that effectively reflects the light. A coating layer can be formed on the surface of the board 1532. At this time, the coating layer has a white color or a silver color to effectively reflect the light.

At least one light emitting device 30 is installed on the board 1532. Each light emitting device 30 may include at least one LED (light emitting diode) chip. The LED chip may include an LED that emits the light of visible ray band having red, green, blue or white color and a UV (ultraviolet) LED that emits UV light.

The light emitting module 1530 can be variously combined to provide various colors and brightness. For instance, the white LED, the red LED and the green LED can be combined to achieve the high color rendering index (CRI).

The connection terminal 1520 is electrically connected to the light emitting module 1530 to supply power to the light emitting module 1530. The connection terminal 1520 has a shape of a socket screw-coupled with the external power source, but the embodiment is not limited thereto. For instance, the connection terminal 1520 can be prepared in the form of a fin inserted into the external power source or connected to the external power source through a wire.

According to the embodiment, the light emitting device 30 has been packaged and mounted on the substrate, thereby realizing a light emitting module. The light emitting device 30 is mounted in the form of an LED chip and packaged, thereby realizing a light emitting module.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The embodiment provides a light emitting device package having a light emitting chip.

The embodiment is applicable to a lighting lamp, a room lamp, an outdoor lamp, an indicator, and a headline of a vehicle having the light emitting device package.

The invention claimed is:

1. A light emitting device comprising:
   a heat sink including a support, a connection portion and a plurality of fins, the connection portion provided between the support and the plurality of fins, the plurality of fins extending from the connection portion in a first direction;
   a body provided around the heat sink, a first portion of the fins being provided in the body and a second portion of the fins extending outside of the body in the first direction;
   first and second lead frames disposed in the body and spaced apart from the heat sink; and
   a light emitting diode disposed on the support of the heat sink, thermally connected to the support portion, and electrically connected to the first and second lead frames,
   wherein the body includes a cavity,
   wherein the light emitting diode is connected to the first and second lead frames disposed in the cavity through a wire, and a molding member is provided to fill the cavity.

2. The light emitting device of claim 1, wherein the connection portion has a dimension different from a dimension of the support, the dimensions being in a second direction, which is different from the first direction.

3. The light emitting device of claim 2, wherein a spacing in the second direction between ends of the first and second lead frames provided in the body is less than the dimension of the connection portion.

4. The light emitting device of claim 2, wherein at least a portion of first and second lead frames is disposed over the connection portion.

5. The light emitting device of claim 1, wherein a dimension of the first portion in the first direction is greater than a dimension of the second portion in the first direction.

6. The light emitting device of claim 1, wherein the heat sink includes at least one of a metallic material or a resin material.

7. The light emitting device of claim 1, wherein the fins have at least one of a plate shape or a cylindrical shape.

8. The light emitting device of claim 1, wherein the molding member covers the light emitting diode, the first and second lead frames, and the support of the heat sink.

9. The light emitting device of claim 1, wherein a dimension of the heat sink in the first direction is at least greater than a dimension between a bottom surface of the cavity and a lower surface of the body in the first direction.

10. The light emitting device of claim 1, wherein a part of the first and second lead frames extending in direction outward from a bottom surface of the cavity is protruded from the outside of the body.

11. The light emitting device of claim 1, further comprising a printed board under the body.

12. The light emitting device of claim 1, further comprising a solder provided between the fins of the heat sink.

13. The light emitting device of claim 11, further comprising a circuit pattern having a plurality of pads spaced apart from each other on the printed board, wherein the pads are connected to the first lead frame, the second lead frame, and the heat dissipation member.

14. The light emitting device of claim 11, wherein the second portion of the fins extend into the printed board.

15. A light emitting device comprising:
a heat sink including a support, a connection portion and a plurality of fins, the connection portion provided between the support and the plurality of fins, the plurality of fins extending from the connection portion in a first direction;
a body provided around the heat sink, a first portion of the fins being provided in the body and a second portion of the fins extending outside of the body in the first direction;
first and second lead frames disposed in the body and spaced apart from the heat sink; and
a light emitting diode disposed on the support of the heat sink, thermally connected to the support portion, and electrically connected to the first and second lead frames,
wherein the body includes a cavity having an open upper portion, and the first and second lead frames and the heat dissipation member are disposed on at least a bottom surface of the cavity,
wherein a part of the first and second lead frames extending in direction outward from a bottom surface of the cavity is protruded from the outside of the body.

16. The light emitting device of claim 15, wherein the connection portion has a dimension different from a dimension of the support, the dimensions being in a second direction, which is different from the first direction.

17. The light emitting device of claim 16, wherein a spacing in the second direction between ends of the first and second lead frames provided in the body is less than the dimension of the connection portion.

18. The light emitting device of claim 16, wherein at least a portion of first and second lead frames is disposed over the connection portion, and
wherein the heat sink includes at least one of a metallic material or a resin material.

19. A light emitting device comprising:
a heat sink including a support, a connection portion and a plurality of fins, the connection portion provided between the support and the plurality of fins, the plurality of fins extending from the connection portion in a first direction;
a body provided around the heat sink, a first portion of the fins being provided in the body and a second portion of the fins extending outside of the body in the first direction;
first and second lead frames disposed in the body and spaced apart from the heat sink; and
a light emitting diode disposed on the support of the heat sink, thermally connected to the support portion, and electrically connected to the first and second lead frames,
wherein the body includes a cavity,
wherein the first and second lead frames and the support of the heat sink are disposed on a bottom surface of the cavity and are located at a lower position than a lower surface of the light emitting diode,
wherein the plurality of fins of the heat sink are extended in a vertical direction from the connection of the heat sink.

20. The light emitting device of claim 19, further comprising a molding member in the cavity,
wherein the light emitting diode is connected to the first and second lead frames disposed in the cavity
wherein a part of each of the first and second lead frames is extended in direction outward in the body.

* * * * *